(12) United States Patent
Zhang

(10) Patent No.: US 6,459,922 B1
(45) Date of Patent: Oct. 1, 2002

(54) POST DATA-ACQUISITION METHOD FOR GENERATING WATER/FAT SEPARATED MR IMAGES HAVING ADJUSTABLE RELAXATION CONTRAST

(75) Inventor: Weiguo Zhang, Foster City, CA (US)

(73) Assignee: Toshiba America MRI, Inc., Tustin, CA (US)

( * ) Notice: Subject to any disclaimer, the term of this patent is extended or adjusted under 35 U.S.C. 154(b) by 0 days.

(21) Appl. No.: 09/281,429

(22) Filed: Mar. 30, 1999

(51) Int. Cl.$^7$ .................................................. A61B 5/05
(52) U.S. Cl. ...................... 600/410; 600/419; 324/307; 324/309; 324/312
(58) Field of Search ............................... 600/410, 408, 600/419; 324/307, 309, 312

(56) References Cited

U.S. PATENT DOCUMENTS

| | | |
|---|---|---|
| 4,502,007 A | 2/1985 | Mee et al. |
| 5,134,372 A | 7/1992 | Inoue |
| 5,229,717 A | 7/1993 | Hinks |
| 5,627,469 A | 5/1997 | Hong et al. |
| 5,909,119 A | 6/1999 | Zhang et al. |

OTHER PUBLICATIONS

Glover, Gary, "Multipoint Dixon Technique for Water and Fat Proton and Susceptibility Imaging", JMRI, vol. 1, No. 5, Sep/Oct. 1991, pp. 521–530.
Glover, G. H. et al., "Three–Point Dixon Technique for True Water/Fat Decomposition with $B_o$ Inhomogeneity Correction", Magnetic Resonance in Medicine 18, 1991, pp. 371–383.
Hardy, Peter et al., "Separation of Fat and Water in Fast Spin–Echo MR Imaging with the Three–Point Dixon Technique", J. Magn. Reson. Imaging, vol. 5, No. 2, Mar/Apr. 1995, pp. 181–185.
Hong, Xiaole et al., "Separating Fat and Water in 3D Breast MR Images Using Triple–Echo 3 Point Dixon Technique", $3^{rd}$ SMR Meeting Book of Abstracts, 1995, p. 646.
Ma, J. et al., "A Single–Scan Imaging Technique for Measurement of the Relative Concentrations of Fat and Water Protons and Their Transverse Relaxation Times," Journal of Magnetic Resonance 125, Article No. MN961086, 1997, pp. 92–101.
Szumowski, Jerzy et al., "Phase Unwrapping in the Three–Point Dixon Method for Fat Suppression MR Imaging", Radiology, vol. 192, 1994, pp. 555–561.
Szumowski, Jerzy et al., "Double–Echo Three–Point Dixon Method for Fat Suppression MRI", Magn. Reson. Med., 34, 1995, pp. 120–124.
Williams, Steven et al., "True Water and Fat MR Imaging with Use of Multiple–Echo Acquisition", Radiology, vol. 173, No. 1, Oct. 1989, pp. 249–253.
Yeung et al., "Separation of True Fat and Water Images by Correcting Magnetic Field Inhomogeneity in Situ", Radiology, vol. 159, No. 3, Jun. 1986, pp. 783–786.
Zhang, Weiguo et al., "Separation of Water and Fat MR Images in a Single Scan at .35 T Using 'Sandwich' Echoes," JMRI, vol. 6, No. 6, Nov/Dec. 1996, pp. 909–917.

Primary Examiner—Marvin M. Lateef
Assistant Examiner—Jeoyuh Lin
(74) Attorney, Agent, or Firm—Nixon & Vanderhye, P.C.

(57) ABSTRACT

A post data-acquisition magnetic resonance imaging (MRI) method is disclosed for generating water/fat separated MR images wherein the resultant contrast in water-only or fat-only images is made adjustable under operator control. Image data is first obtained using a single-scan three-point Dixon MRI scan sequence having a specific nuclear magnetic response (NMR) signal echo time, TE. The timing of read-out gradient pulses during the MRI imaging scan sequence is selected according to the chemical-shift difference between water and fat signals so that the water and fat NMR signals evolve between them an angle of $\pi$ radians during an inter-echo time $\Delta TE$. Water/fat separated images of variable contrast are then produced by reprocessing the acquired image data using different operator selected values for the contrast echo time (newTE) when correcting for relaxation.

7 Claims, 4 Drawing Sheets

20 ms 36 ms 60 ms 80 ms 20 ms 36 ms 60 ms 80 ms

POST DATA-ACQUISITION METHOD FOR GENERATING WATER/FAT SEPARATED MR IMAGES HAVING ADJUSTABLE RELAXATION CONTRAST

FIELD OF THE INVENTION

This invention relates generally to magnetic resonance (MR) imaging (MRI) techniques. In particular, it relates to single-scan three-point Dixon methods for generating water/fat component images and, more particularly, to a post data-acquisition method for generating water/fat separated MR images wherein the relaxation contrasts are adjustable.

BACKGROUND OF THE INVENTION

Magnetic Resonance Imaging (MRI) has become a widely accepted and commercially available technique for obtaining digitized visual images representing the internal structure of objects (such as the human body) having substantial populations of atomic nuclei that are susceptible to nuclear magnetic resonance (NMR) phenomena. In MRI nuclei in a body to be imaged are polarized by imposing a strong main magnetic field $H_0$ on the nuclei. Selected nuclei are excited by imposing a radio frequency (RF) signal at a particular NMR frequency. By spatially distributing the localized magnetic fields, and then suitably analyzing the resulting RF responses from the nuclei, a map or image of relative NMR responses as a function of the location of the nuclei can be determined. Following a Fourier analysis, data representing the NMR responses in space can be displayed on a CRT.

As shown in FIG. 1, the NMR imaging system typically includes a magnet 10 to impose the static magnetic field, gradient coils 14 for imposing spatially distributed magnetic fields along three orthogonal coordinates, and RF coils 15 and 16 to transmit and receive RF signals to and from the selected nuclei. The NMR signal received by the coil 16 is provided to computer/image processor 19 which processes the data into an image displayed on display 24. The displayed image is composed of picture elements called "pixels", defined as the field of view (FOV) divided by the number of data elements (N). The intensity of a pixel is proportional to the NMR signal intensity of the contents of a corresponding volume element or "voxel" of the object being imaged. The computer/processor 19 also controls the operation of RF coils 15 and 16 and gradient coils 14 through the RF amplifier/detector 21 and 22 and gradient amplifiers 20, respectively.

Only nuclei with odd number of protons and/or neutrons have a magnetic moment and thus are susceptible to NMR phenomena. In MRI, a strong static magnetic field is employed to align nuclei, generating a gross magnetization vector aligned in parallel to the main magnetic field at equilibrium. A second magnetic field, applied transverse to the first field as a single RF pulse, pumps energy into the nuclei, which causes the gross magnetization vector to flip by, for example, 90°. After this excitation, the nuclei precess and gradually relax back into alignment with the static field. As the nuclei precess and relax, they will induce a weak but detectable electrical energy in the surrounding coils that is known as free induction decay (FID). These FID signals (and/or magnetic gradient-refocused field echoes thereof), collectively referred to herein as MR signals, are then analyzed by signal processor 19 to produce images of the nuclei in space.

An operation whereby the various coils produces RF excitation pulses and gradient fields to result in and acquire an MR signal is called an MRI "acquisition sequence". A graphical representation of an example MRI acquisition sequence used for three-dimensional (3-D) MRI is shown in FIG. 2. In this example, the particular timing of applied pulses and fields is known as a field-echo sequence since the MR signals appear as gradient-refocused field echoes. First, a gradient field, $G_{slice}$, is superimposed along the main field to sensitize a slab of nuclei in the body to be imaged to a particular RF resonance frequency. An RF excitation field or nutation pulse, θ, is then applied at the particular frequency to tip the magnetization away from equilibrium. Thereafter, pulsed magnetic gradient fields of changing magnitudes, $G_{pe}$ and $G_{slice}$, are used to phase encode the nuclei by inducing a temporary frequency difference, and hence phase differences, between nuclei in different locations along a specific direction within the slab. At the same time, another pulsed magnetic gradient field, $G_{ro}$, is applied perpendicular to the direction of $G_{pe}$, in a readout (ro) direction that first de-phases and then rephases the precessing nuclei—which results in producing a field-echo MR signal represented in FIG. 2 as S. The time from the center of nutating pulse, θ, to the center of the field-echo MR signal is designated as the echo time, TE, and the entire pulse sequence duration is designated as TR.

Essentially, the applied gradient field, $G_{ro}$, frequency encodes the selected slab of nuclei in the readout direction. The resultant MR signal, S, (also called "raw data" or "k-space data") is then read and analyzed by Fourier analysis. A frequency domain plot of that analysis is then scaled to render information about the nuclei population in Fourier space (also referred to as the image domain), which corresponds to an X-Y-Z position.

A magnetization vector can be decomposed into longitudinal and transverse components in reference to the main $B_0$ field. Conventionally, the longitudinal component is defined as parallel to the $B_0$ field and the transverse component is defined as perpendicular to $B_0$. Once the magnetic vectors are disturbed from their equilibrium, processes known as "relaxation" cause the longitudinal component to recover to an equilibrium magnitude, $M_0$, in alignment with the background $B_0$ field, and the transverse component to decay. These relaxation processes are respectively termed the "spin-lattice relaxation" and the "spin-spin relaxation" and are characterized by exponentials whose defined time constants are labeled as $T_1$ and $T_2$, respectively. In addition to spin-spin ($T_2$) relaxation, inhomogeneities in magnetic field cause the transverse component to further decay. An "apparent relaxation" time constant, $T_2$, is therefore defined as characterizing transverse signal decay due to both spin-spin relaxation and the presence of $B_0$ field inhomogeneities.

The NMR frequency and the main $B_0$ field are related by the Larmor relationship. This relationship states that the angular frequency, $\omega_0$, of the precession of the nuclei is the product of the magnetic field, $B_0$, and the so-called magnetogyric ratio, γ, a fundamental physical constant for each nuclear species:

$$\omega_0 = B_0 \cdot \gamma(1-\sigma)$$

where σ is a shielding factor representing the chemical environment around the nuclei, commonly referred to as the "chemical shift."

The RF spin-nutating pulse will, of course, tip more than one species of the target isotope in a particular area. After being tipped away from equilibrium, each species of nuclei will begin to precess at their own characteristic speed. The phase of the precessing nuclei species will gradually differ (de-phase) as a result of such parameters as the physical or chemical environment in which the nuclei are located. Nuclei in fat, for example, precess at a different rate than do nuclei in water due to the effects of chemical shift. In addition, inhomogeneities in the magnetic field also contribute to de-phasing of the nutated precessing nuclei.

Since hydrogen nuclei have a readily discernible NMR signal and are the most abundant isotope of the human body, human MRI primarily images the NMR signal from the hydrogen nuclei. Water and fat are the main tissue components containing hydrogen nuclei.

In addition to using the frequency information content of an MR signal to generate images, the phase of an MR signal in the frequency domain can be utilized to provide information indicative of some physical quantity. For example, depending on the type of pulse sequence used, the MR phase can be used to differentiate between water and fat. It can also represent a main $B_0$ field inhomogeneity or can be proportional to the velocity of the moving spins.

I. Water and Fat Separation

Although MR images of both water and fat may contain the same or different diagnostic information, they often interfere with each other's interpretation when overlapped in an MRI image, and thus make it difficult to properly interpret the composite MR image.

At high-magnetic-field strengths, the separation of water and fat images or suppression of one of these two components can be achieved using selective excitation or non-excitation approaches. At mid- or low-field strengths, approaches based on chemical shift selectivity become impractical, if not impossible. At all field strengths, the difficulties of water/fat image separation are further exacerbated when imhomogeneities are present in the magnetic field.

One group of techniques, known as "Three-Point Dixon" methods, have attractive features for mid- or low-field strength applications. These methods require three images to obtain enough information for water/fat separation with correction of the effect of $B_0$ field inhomogeneities. The images can be acquired using spin-echo as well as field-echo sequences, in three separate scans, as described in "Three-Point Dixon Technique for True-Water/fat Decompositions with $B_0$ Inhomogeneity Corrected," by Glover et al., *Magnetic Resonance in Medicine* 18, 371-383 (1991); in two scans, as described in "Separation of True Fat and Water Images by Correcting Magnetic Field Inhomogeneity In Situ", by Yenng et al., *Radiology* 159, 783-786 (1986), or in a single scan, as described in "True Water and Fat MR Imaging with Use of Multiple-Echo Acquisition", by William et al., *Radiology* 173, 249-253 (1989) and "Separation of Water and Fat MR Images in a Single Scan at 0.35 T Using 'Sandwich' Echoes," by Zhang et al., JMRI 6, 909-917 (1996), all the above of which are incorporated herein by reference.

In accordance with the above Three-Point Dixon methods, acquisitions of the three images are controlled so that the phase difference between the water image information and the fat image information changes by $\pm\pi$ radians (180°) between the three images (i.e., $S_{-\pi}$, $S_0$, and $S_\pi$). Data from the three images is then processed to remove the effects of magnetic field inhomogeneities and, ultimately, to generate separate water and fat images. In accordance with the method, magnetic field inhomogeneities are compensated by using information from two of the three images through a process of "phase unwrapping."

Since the phase angle of a complex number is unambiguous only between $-\pi$ and $\pi$, the phase of an MRI signal cannot be unambiguously determined from its argument, and any phase values beyond $-\pi$ or $\pi$ will be "wrapped" back around into values between $-\pi$ and $\pi$. In this context, phase unwrapping is the process of determining the absolute phase of a complex signal given the measurement of its principal phase value. (Two of such processes are outlined further below).

Ignoring the effects of relaxation, the NMR signal data comprising the three Dixon images can be described by:

$$S_{-\pi}=(W-Fe^{-i\Psi_{di0}})e^{-i(\phi_0-\phi)}$$

$$S_0=(W+Fe^{-i\Psi_0})e^{-i\phi_0}$$

$$S_\pi=(W-Fe^{-i\Psi_0})e^{-i(\phi_0+\phi)}$$

where W and F represent water and fat signals, respectively; $\Psi_0$ is the phase difference between water and fat observed in $S_0$; $\phi_0$ is the phase in $S_0$ due to field inhomogeneities and other system sources; $\phi$ is phase change between the successive echoes induced by field inhomogeneities.

To correct for field inhomogeneities, the compensation angle, $\phi$, is determined from $S_{-\pi}$ and $S_\pi$ by the process of phase unwrapping in accordance with the following relationship:

$$\phi=\tfrac{1}{2}\text{ unwrap }\{arg(S_{-\pi}\cdot S^*_\pi)\}$$

where arg ( ) produces the phase angle of a complex number, and * represents complex conjugation.

Water-only images, W, and fat-only images, F, can then be reconstructed in accordance with the following two relationships:

$$W=S_o+0.5S_\pi e^{+i\phi}+0.5S_{-\pi}e^{-i\phi}$$

$$F=S_o-0.5S_\pi e^{i\phi}-0.5S_{-\pi}e^{-i\phi}$$

One can also rely on just one image, S, in which the water and fat signals have a difference in phase by 180°. Though water and fat signals are not truly separated in such cases, image pixels can be sorted in accordance to whether they are dominated by water or by fat by applying the following relationships:

$$S=(W-F)e^{-i\phi}$$

$$\phi=-\tfrac{1}{2}\text{ unwrap}\{arg(S^2)\}$$

$$I_{water-pixel}=|S|+Se^{i\phi}$$

$$I_{fat-pixel}=|S|-Se^{i\phi}$$

where $I_{water-pixel}$ and $I_{fat-pixel}$ represent water-dominant and fat-dominant pixels, respectively.

II. Phase Unwrapping

Preferred algorithms for phase unwrapping as implemented in the present invention involve a combination of modeling the static magnetic field using polynomial functions and a "guided" phase unwrapping by "region-growing".

i. Polynomial Field Modeling

The magnetic field is modeled using a polynomial function:

$$B(x,y)=\sum_{n=1}^{3}[a_n(x-x_o)^n+b_n(y-y_o)^n]+c_o$$

To find the coefficients $a_n$ and $b_n$, partial spatial derivatives of the phase value φ are calculated and fit to polynomial functions as follows:

$$\frac{\partial \phi(x, y)}{\partial x} = p_3 x^2 + p_2 x + p_1$$

$$\frac{\partial \phi(x, y)}{\partial y} = q_3 y^2 + q_2 y + q_1$$

Fitting is performed using a weighted least-square with the weighting factors determined according to:

$$w(x, y) = \frac{S(x, y)}{S_{max}}$$

where $S(x,y)$ is the pixel value in the in-phase image and $S_{max}$ is the maximum of that image.

Using $p_n$ and $q_n$, $a_n$ and $b_n$ are calculated according to the following equations:

$$a_1 = p_1 + 2p_2 x_o + p_3 x_o^2$$

$$a_2 = \tfrac{1}{2} p_2 + p_3 x_o$$

$$a_3 = \tfrac{1}{3} p_3$$

$$b_1 = q_1 + 2q_2 y_o + q_3 y_o^2$$

$$b_2 = \tfrac{1}{2} q_2 + q_3 y_o$$

$$b_3 = \tfrac{1}{3} q_3$$

ii. Phase Unwrapping by Guided Region Growing

The phase image is unwrapped using a guided region-growing algorithm as follows:

(a) A pixel in the image is chosen as the subseed for unwrapping and the measured phase value is assigned to the final phase value used for water and fat image reconstruction.

$$\phi_f(x_0, y_0) = \phi(x_0, y_0)$$

(b) The subseed is selected so that all pixels in a 6×6 region centered at the subseed have sufficient signal strength. The four immediately neighboring pixels of the subseed are first unwrapped by comparing the phase values to the subseed value. If the difference is larger than a predetermined threshold, a 2π unwrapping is executed:

$$\phi_f = \phi + sign(\Delta\phi) \times 2\pi$$

$$\Delta\phi = \phi - \phi(x_0, y_0)$$

where:

(c) A 3×3 pixel region centered at the subseed is then built based on the five already-determined pixels. A 2π phase unwrapping is executed whenever the phase difference between a pixel and its already-unwrapped, immediate neighboring pixel is larger than the threshold.

(d) The 3×3 region is then expanded to 4×4 region with a three-pixel prediction:

$$\phi_p = \tfrac{1}{3}(\phi_f^{-3} + \phi_f^{-2} + \phi_f^{-1}) + \tfrac{1}{3}(3\Delta\phi^{-1} + 2\Delta\phi^{-2} + \Delta\phi^{-3})$$

where $\phi_p$ is the predicted phase value of a pixel; $\phi_f^{-i}$ (i=1, 2, 3) are the phase values of the already unwrapped first (i=1), second (i=2), and third (i=3) neighboring pixels; $\Delta\phi^{-i}$ are the phase spatial derivatives of the already-unwrapped, neighboring pixel along the direction of the prediction.

Unwrapping is executed if $\Delta\phi = \phi - \phi_p$ is larger than the threshold.

(e) Continuing from the 4×4 seed region, a four column by four rows "cross" region is built using a four-pixel prediction:

$$\phi_p = \tfrac{1}{4}(\phi_f^{-4} + \phi_f^{-3} + \phi_f^{-2} + \phi_f^{-1}) + \tfrac{1}{4}(4\Delta\phi_f^{-1} + 3\Delta\phi_f^{-2} + 2\Delta\phi_f^{-3} + \Delta\phi_f^{-4})$$

(f) Using the cross, the four quadrants of the image are unwrapped using the same 4-pixel prediction approach, but in two directions. Unwrapping is executed when both directions show the same execution for unwrapping. In other situations, the average of the predicted values is used. When the pixel value is below the intensity threshold, the phase value is again set to the predicted average value.

In the past, water/fat separation at low and mid-level field intensities have been most successfully achieved using the above discussed multiple-point Dixon methods. Moreover, as described above, a single-scan three-point Dixon method (with the water and fat signals evolving a phase difference of π during the inter-echo time ΔTE) can acquire three consecutive NMR echo signals after only a single excitation pulse—resulting in a significant reduction in scanning-time. However, in addition to the phase information used to separate water/fat with correction of $B_o$ inhomogenities, the three-point Dixon echo signals contain information about spin relaxation decay. Accordingly, the present invention exploits such information after data acquisition to provide water/fat separated images with adjustable relaxation contrasts.

SUMMARY OF THE INVENTION

The present invention is a post data-acquisition MRI technique for generating water/fat separated MR images wherein the resultant relaxation image contrast in water-only or fat-only images is adjustable under operator control by selecting a value for the contrast echo time (newTE) used in constructing the water-only or fat-only images.

In accordance with the present invention, single-scan three-point Dixon imaging is used to obtain the NMR raw signal data. Basically, in three-point Dixon imaging, a slice-selective excitation pulse is followed by the acquisition of three separate gradient-refocused signal-echoes. Each signal echo is acquired by controlling the timing and polarity of an applied read-out gradient. The time (ΔTE) between the signal-echoes ($S_1$, $S_2$, $S_3$) is selected according to the chemical-shift difference between water and fat signals so that the two signals develop between them an angular difference of π radians (180°) during the inter-echo time.

After Fourier conversion of the raw data (k-space data) to complex frequency-domain data, also called "image-domain" data, background magnetic field inhomogeneities are compensated by obtaining the compensation phase from the $S_1$ and $S_3$ signal-echoes using a guided region-growing phase unwrapping technique. Next, the effects of $T_2$ relaxation or $T^*_2$ relaxation are measured from the signal data. The acquired image data are then corrected according to the relaxation measurements based on an operator-selected new contrast TE (newTE) value. Water and fat signals are finally separated from the corrected image data, producing water-only or fat-only images with enhanced relaxation contrast.

BRIEF DESCRIPTION OF THE DRAWINGS

The purpose and advantages gained by the present invention will be understood by careful study of the following detailed description of the presently preferred embodiment with particular reference to the accompanying drawings, of which.

DETAILED DESCRIPTION OF THE PRESENTLY PREFERRED EMBODIMENT

As is well-known, nuclei precess at a particular frequency with a particular phase. By applying gradient fields to the nuclei in different orthogonal directions, the frequency and phase of the precessions can be used to spatially encode the nuclei. In one orthogonal direction, a "slice" of nuclei are excited. Within that slice, MR signals are extracted from the remaining two dimensions of the slice, using the frequency of precession of the selected nuclei to spatially encode the nuclei in one direction and using the phase of precession of the selected nuclei to spatially encode the nuclei in the second (or other) direction(s). By analyzing the complex frequency and phase of the resultant MR signal, information about the nuclei density in the selected slice can be determined.

Figure 1:
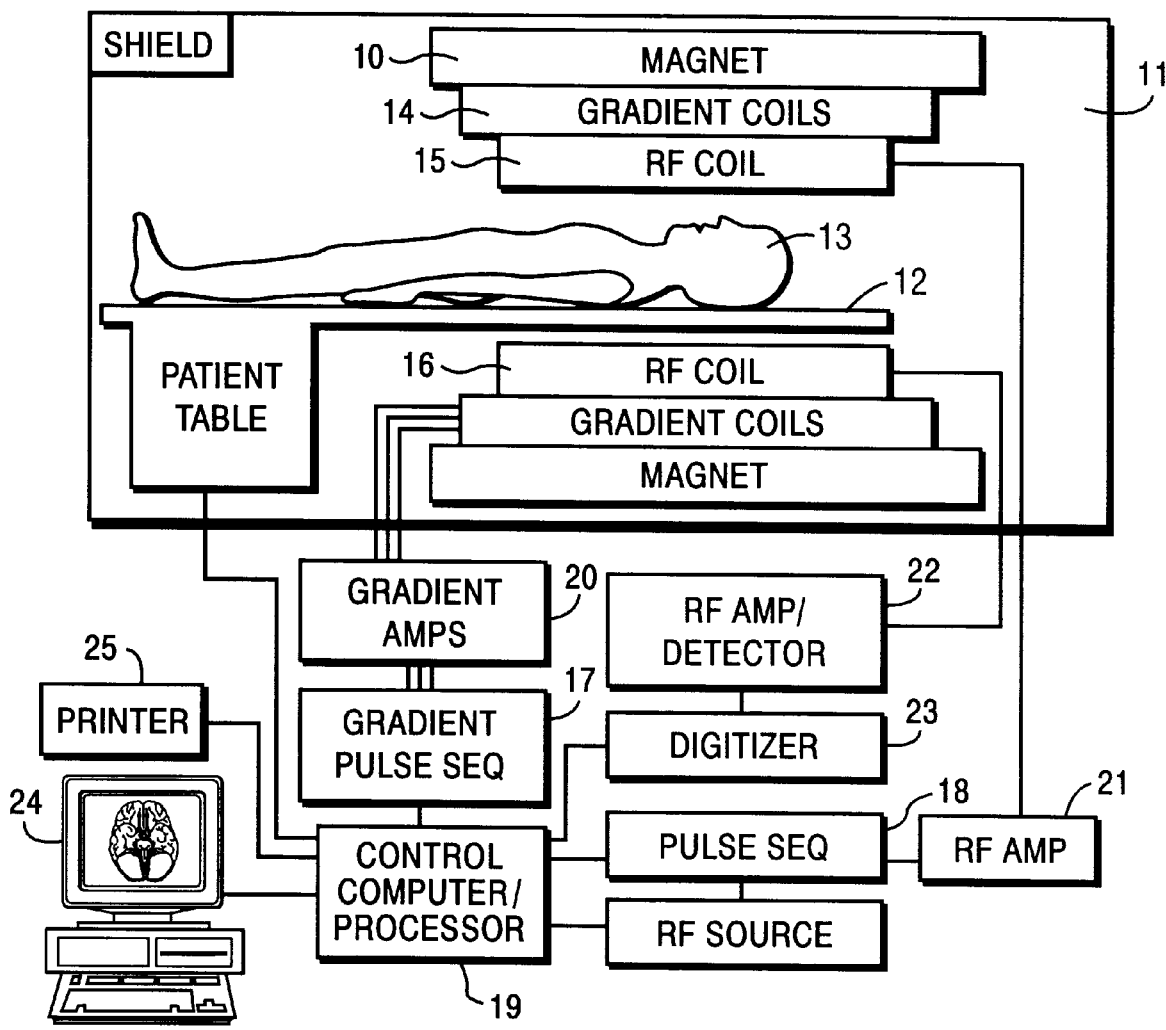
FIG. 1 is a schematic diagram of an example MRI system.
Figure 2:
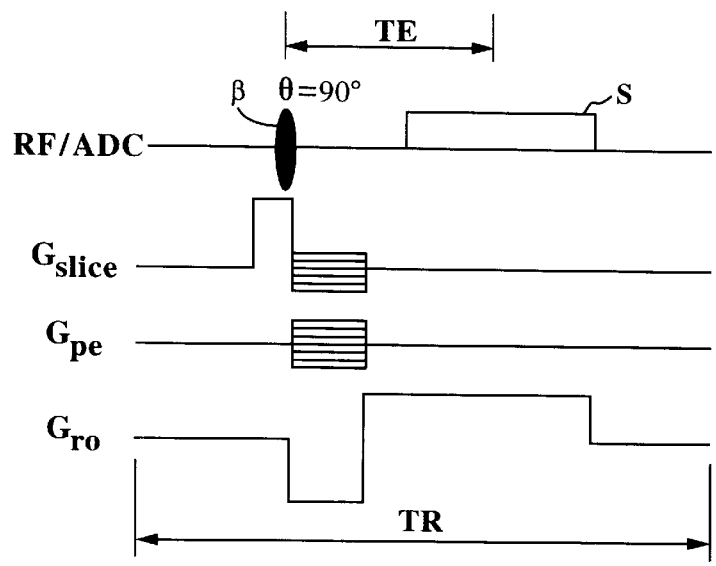
FIG. 2 is an RF and gradient waveform timing diagram of an example MRI pulse sequence for generating a field-echo MRI response.

FIG. 1 depicts an MRI system. One example of such a system is the Toshiba OPART™ MRI system. Such an MRI system may comprise a large polarizing magnet structure 10 which generates a substantially uniform homogeneous polarizing magnetic field $B_0$ within a patient imaging volume 11. A suitable carriage 12 inserts the desired portion of patient 13 anatomy within the image volume 11. Magnetic gradients are selectively created by electro-magnetic gradient coils 14. RF nuclei nutation pulses are transmitted into the patient tissue within the image volume by RF coil 15. The RF responses constituting the MR signal are received from the patient tissue via suitable RF detection coil structures 16.

To acquire MRI data, the MRI system generates magnetic gradient and RF nutation pulses via MRI pulse sequence controllers 17 and 18 under the control of programmable computer/processor 19. In addition, processor 19 controls gradient pulse amplifier 20 and RF source and amplifier circuits 21 and 22. The MR amplifier signal (RF detector) circuits 22 are suitably interfaced with MR signal RF coils 16 located within the shielded MRI system gantry. The received MR responses are digitized by digitizer 23 and passed to processor 19 which typically includes an array processor for image processing and suitable computer program storage media (not shown) wherein programs are stored and selectively utilized so as to control the acquisition and processing of MR signal data and to produce image displays on a CRT of control terminal 24. The MRI system is provided with a control terminal 24 which may include suitable keyboard switches and the like for exerting operator control over the imaging sequence controllers, 17 and 18. Images may also be recorded directly on film or on other suitable media by printing device 25.

In conjunction with system computer/processor 19, an operator is typically presented with a menu of choices for MRI sequences and data processing techniques. In the example embodiment of this invention, one of those choices available to the MRI system operator is a program for generating water/fat component images using a single-scan three-point Dixon MRI imaging sequence and a program for implementing a post data acquisition method of producing additional images having selectively variable contrasts in accordance with the present invention. The generation of a suitable computer program or such specific instructions for system computer/image processor 19 to effect the described process of the present invention is believed to be well within the ability of those skilled in the art in view of the particular data processing method described below and the totality of the disclosure set forth herein.

The Imaging Sequence

Figure 3A:
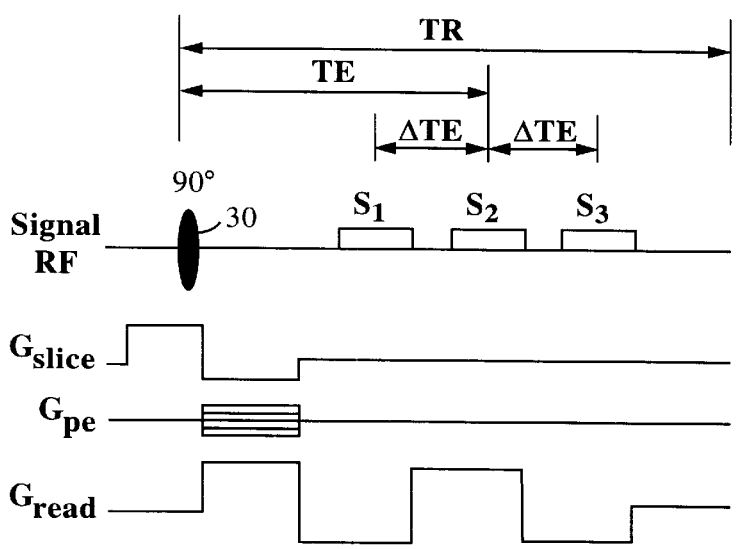
FIG. 3A is an RF and gradient waveform timing diagram of an example single-scan three-point Dixon sequence for generating a spin-echo response.
Figure 3B:
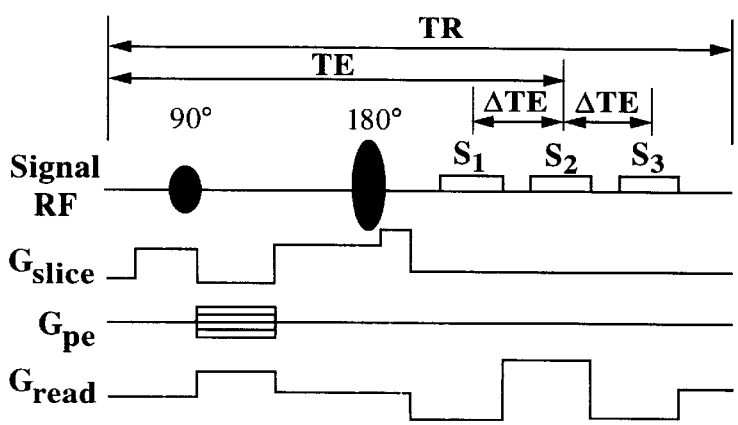
FIG. 3B is an RF and gradient waveform timing diagram of an example single-scan three-point Dixon sequence for generating a field-echo response.

Referring to FIGS. 3A and 3B, an imaging sequence of the present invention basically consists of an RF nuclei nutation ("excitation") pulse, 30, accompanied by the generation of a slice selection gradient pulse, $G_{slice}$, and a phase encoding gradient pulse, $G_{pe}$, followed by three appropriately timed read-out gradient pulses, $G_{read}$, which result in the acquisition of three equally-spaced field-echoes, $S_1$, $S_2$ and $S_3$. The timing of read-out gradient pulses is selected according to the chemical-shift difference between water and fat signals so that the two signals evolve between them an angle of $\pi$ radians during the inter-echo time, $\Delta TE$.

The Data Processing Method—Water/fat Separation Analysis for Producing Variable Relaxation Contrasts Since three-point Dixon echo signals inherently contain spin-relaxation decay information, that information can be used to generate images of adjustable relaxation contrast. This is accomplished by using an operator-selected new contrast TE (newTE) when compensating the signal data for spin-spin relaxation as described below.

When taking into consideration the effects of $T_2$ and $T^*_2$ relaxation, the three-point Dixon signals can be described in terms of water and fat signal content by equation 1 below:

$$S_m = \lambda_m S_m^0 (m=1,2,3) \quad \text{Equ. 1}$$

with $$S_1^0 = (W^0 - F^0 e^{-i\Psi_0})e^{-i(\phi_0-\phi)} \quad \text{Equ. 2}$$

$$S_2^0 = (W^0 + F^0 e^{-i\Psi_0})e^{-i\phi_0} \quad \text{Equ. 3}$$

$$S_3^0 = (W^0 - F^0 e^{-i\Psi_0})e^{-i(\phi_0+\phi)} \quad \text{Equ. 4}$$

and where, for spin echo:

$$\lambda_1 = e^{\frac{-(TE-\Delta TE)}{T_2}} e^{\frac{-\Delta TE}{T_2^*}}$$

$$\lambda_2 = e^{\frac{-TE}{T_2}}$$

$$\lambda_3 = e^{\frac{-(TE-\Delta TE)}{T_2}} e^{\frac{-\Delta TE}{T_2^*}}$$

for field echo:

$$\lambda_1 = e^{\frac{-(TE-\Delta TE)}{T_2^*}} \quad \text{Equ. 5}$$

$$\lambda_2 = e^{\frac{-TE}{T_2^*}} \quad \text{Equ. 6}$$

$$\lambda_3 = e^{\frac{-(TE+\Delta TE)}{T_2^*}} \quad \text{Equ. 7}$$

and where $W^0$ and $F^0$ are water and fat signals at equilibrium; $\Psi$ and $\phi_0$ are phase difference between water and fat and inhomogeneity phase at the center of $S_2$, respectively; $\phi$ is inhomogeneity phase induced during the inter-echo time.

Spin-spin relaxation decay time, $T_2$, and apparent relaxation time, $T^*_2$, can be estimated from the NMR signal echoes obtained from a single-scan three-point Dixon imaging sequence for producing spin-echoes from Equation 8 as follows:

$$T_2 = -\frac{\ln\left|\frac{S_3}{S_1}\right|}{2\Delta TE} \quad \text{Equ. 8}$$

and from a similar imaging sequence for producing for field-echoes from Equation 9 as follows:

$$T^*_2 = -\frac{\ln\left|\frac{S_3}{S_1}\right|}{2\Delta TE} \quad \text{Equ. 9}$$

The three-point Dixon signals are then magnitude-corrected to correspond to a new and different echo time, newTE, which is selectable by the MRI system operator. A signal magnitude correction is then implemented by the computer image processor in accordance with the following equations:

$$\xi_1 = e^{\frac{-(newTE-TE+\Delta TE)}{T_2 \text{ or } T^*_2}} \quad \text{Equ. 11}$$

$$\xi_2 = e^{\frac{-(newTE-TE)}{T_2 \text{ or } T^*_2}} \quad \text{Equ. 12}$$

$$\xi_3 = e^{\frac{-(newTE-TE-\Delta TE)}{T_2 \text{ or } T^*_2}} \quad \text{Equ. 13}$$

where $S'_m$ is the magnitude corrected signal data and newTE is an operator selected contrast echo time value, different from the TE at which the NMR signal data was originally obtained.

The magnitude corrected signals are then further processed to separate the water and fat signals with correction for $B_0$ inhomogeneities in the manner as discussed above.

Example Image Contrast Alteration

Referring now to FIGS. 4 and 5, human three-point Dixon images were acquired using a Toshiba OPART™ MRI system operating at 0.35 Tesla. The k-space data were first Fourier transformed to yield images which were then corrected for relaxation decay according to an operator-selected different contrast echo time value, newTE. The magnitude-corrected images were further processed to separate water and fat with correction of $B_0$ inhomogeneities as described above.

Figure 4A:
FIGS. 4A–4D are image prints of a spin-echo water-only image of a human knee processed from three-point Dixon images having various operator selected contrast echo times (newTE) in accordance with the present invention.
Figure 4B:
Figure 4C:
Figure 4D:
Figure 5A:
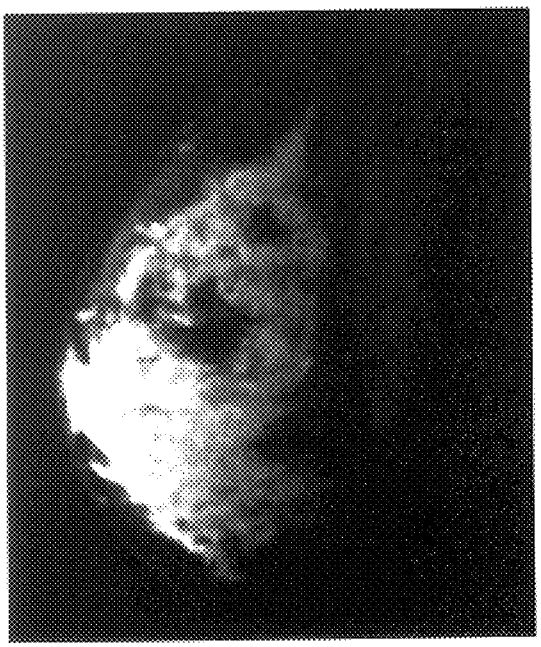
FIGS. 5A–5D are image prints of a field-echo water-only image of a human breast processed from three-point Dixon images having various operator selected contrast echo times (newTE) in accordance with the present invention.
Figure 5B:
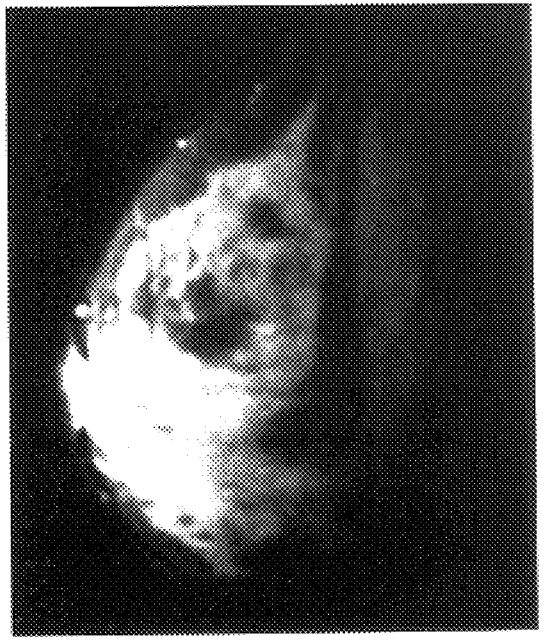
Figure 5C:
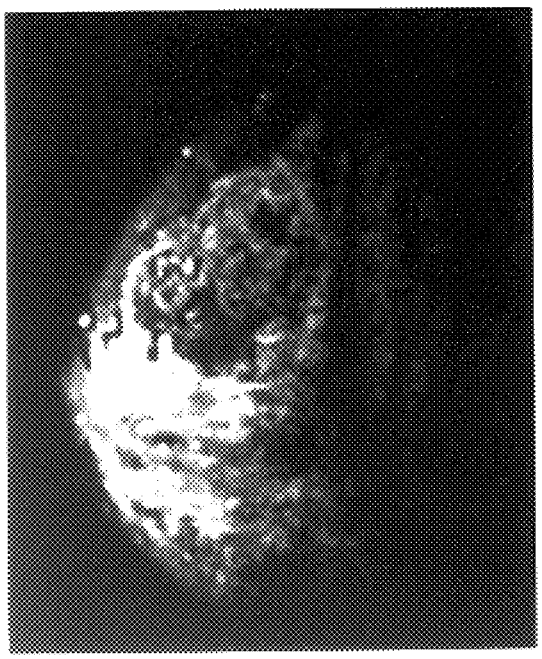
Figure 5D:

FIGS. 4A through 4D show spin-echo water-only images of a human knee obtained by processing three-point Dixon data, originally acquired at a TE=36 ms (FIG. 4B), with different operator selected newTE values of 20 ms (FIG. 4A), 60 ms (FIG. 4C) and 80 ms (FIG. 4D). Likewise, FIGS. 5A through 5D show field-echo water-only images of a human breast, originally acquired with TE=20 ms (FIG. 5A), processed in accordance with the present invention using different operator selected newTE values of 36 ms (FIG. 5B), 60 ms (FIG. 5C) and 80 ms (FIG. 5D). As evidence by the Figures, a judicious selection of newTE values will determine the contrast obtained in the resultant image and allow production of images having various contrasts as desired.

While the invention has been described in connection with what is presently considered to be the most practical and preferred embodiment, it is to be understood that the, invention is not to be limited to the disclosed embodiment, but on the contrary, is intended without further analysis, to so fully reveal the gist of the present invention that others can, by applying contemporary knowledge, readily adapt it for various applications without omitting features that, from the standpoint of prior art, fairly constitute essential characteristics of the generic and specific aspects of the instant contribution to the art and, therefore, such adaptations should and are intended to be comprehended within the meaning and range of equivalence of the appended claims.

What is claimed is:

1. A method of varying image contrast in water-only or fat-only MR images obtained from an MRI apparatus, comprising the steps of:

a) obtaining NMR image data using a single-scan three-point Dixon imaging sequence having a specific predetermined response signal echo time (TE);

b) computing magnitude-corrected echo signal data, $S'_m$, from echo signal data, $S_m$, acquired in step (a), for each echo signal in the three-point Dixon sequence, according to the following equations:

$$\xi_1 = e^{\frac{-(newTE-TE+\Delta TE)}{T_2 \text{ or } T^*_2}};$$

$$\xi_2 = e^{\frac{-(newTE-TE)}{T_2 \text{ or } T^*_2}};$$

$$\xi_3 = e^{\frac{-(newTE-TE-\Delta TE)}{T_2 \text{ or } T^*_2}};$$

where $S'_m = \xi_m S_m$ and newTE is a selectable value corresponding to an echo time different from that of an echo time (TE) originally used in obtaining the NMR image data; and c) further processing the magnitude-corrected echo signal data computed in step (b) using a known three-point Dixon water-fat separation technique having $B_0$ inhomogeneity correction;

wherein different values used for newTE have an effect of altering resultant image contrast for water-only or fat-only images.

2. The method of claim 1 wherein said different value of contrast echo time (newTE) is operator selectable.

3. The method of claim 1 wherein a timing of read-out gradient pulses during said imaging sequence is selected according to a chemical-shift difference between water and fat signals so that said water and fat signals evolve between them an angle of $\pi$ radians during an inter-echo time ($\Delta TE$).

4. The method of claim 2 wherein a single-scan three-point Dixon imaging sequence having a TE value in a range of 10–100 ms is used to acquire NMR image data.

5. An apparatus for developing either water or fat species-fraction image data from an NMR imaging sequence on an MRI system, said apparatus comprising a computer including a storage memory and I/O devices, said memory having stored therein rules for performing three-point Dixon NMR signal analysis to correct for relaxation decay, said computer programmed to:

acquire NMR signal data from a single-scan three-point Dixon imaging sequence having a specific predetermined NMR response signal echo time (TE);

compute magnitude-corrected echo signal data, $S'_m$, from echo signal data, $S_m$, acquired for each echo signal in the three-point Dixon sequence, according to the following equations:

$$\xi_1 = e^{\frac{-(newTE-TE+\Delta TE)}{T_2 \text{ or } T_2^*}};$$

$$\xi_2 = e^{\frac{-(newTE-TE)}{T_2 \text{ or } T_2^*}};$$

$$\xi_3 = e^{\frac{-(newTE-TE-\Delta TE)}{T_2 \text{ or } T_2^*}};$$

where $S'_m = \xi_m S_m$ and newTE is a selectable value corresponding to an echo time different from said predetermined NMR response signal echo time; and further process the magnitude-corrected echo signal data using a known three-point Dixon water-fat separation technique having $B_0$ inhomogeneity correction;

wherein different values used for newTE have an effect of altering resultant image contrast for water-only or fat-only images.

6. The apparatus of claim 5 wherein said different value of contrast echo time, newTE, is operator selectable.

7. The apparatus of claim 5 wherein a timing of read-out gradient pulses during said imaging sequence is selected according to a chemical-shift difference between water and fat signals so that said water and fat signals evolve between them an angle of $\pi$ radians during an inter-echo time ($\Delta TE$).

* * * * *